(12) United States Patent
Anslow et al.

(10) Patent No.: US 6,750,404 B1
(45) Date of Patent: Jun. 15, 2004

(54) HIGH DENSITY PRINTED WIRING BOARD HAVING IN-VIA SURFACE MOUNTING PADS

(75) Inventors: Philip Andrew Anslow, Herts (GB); Geoff A Fuller, Braintree (GB); Ing. Joan Tourne, Echt (NL)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/451,127

(22) Filed: Nov. 30, 1999

(30) Foreign Application Priority Data

Dec. 23, 1998 (GB) ............................................. 9828656

(51) Int. Cl.⁷ ............................. H01R 12/04; H05K 1/11
(52) U.S. Cl. ..................... 174/262; 174/261; 174/267
(58) Field of Search .............................. 174/262, 263, 174/264, 265, 266, 267, 261; 361/792–795

(56) References Cited

U.S. PATENT DOCUMENTS

| | | | | |
|---|---|---|---|---|
| 4,641,425 A | * | 2/1987 | Dubuisson et al. | 29/830 |
| 4,912,603 A | | 3/1990 | Seyama | 361/409 |
| 5,315,072 A | | 5/1994 | Arai et al. | 174/262 |
| 5,444,189 A | | 8/1995 | Nakaso et al. | 174/262 |
| 5,455,393 A | | 10/1995 | Ohshima et al. | 174/250 |
| 5,491,303 A | * | 2/1996 | Weiss | 174/262 |
| 5,526,564 A | | 6/1996 | Ohshima et al. | 29/852 |
| 5,638,598 A | | 6/1997 | Nakaso et al. | 29/852 |
| 5,758,413 A | * | 6/1998 | Chong et al. | 29/852 |
| 5,764,485 A | * | 6/1998 | Lebaschi | 361/774 |
| 5,875,102 A | * | 2/1999 | Barrow | 361/777 |
| 5,948,533 A | * | 9/1999 | Gallagher et al. | 428/418 |
| 5,979,044 A | * | 11/1999 | Sumi et al. | 174/262 |
| 6,323,436 B1 | * | 11/2001 | Hedrick et al. | 174/255 |

FOREIGN PATENT DOCUMENTS

| | | |
|---|---|---|
| JP | 4-291991 | 10/1992 |
| JP | 8-340164 | 12/1996 |

* cited by examiner

Primary Examiner—David A. Zarneke
Assistant Examiner—Jeremy Norris
(74) Attorney, Agent, or Firm—Barnes & Thornburg

(57) ABSTRACT

A multilayer printed wiring board in which surface contact pads are formed by depositing electrically conductive metallic layers directly over blind holes/vias. This allows ball grid array devices to be mounted on the printed wiring boards with a greater contact pad density than is the case where the contact pads are formed to the sides of the blind holes/vias. In a method of manufacturing printed wiring boards embodying the invention, it is desirable to treat the surfaces of the board to prepare the outward facing surfaces of the plated layers of the blind vias to receive copper capping layers.

1 Claim, 6 Drawing Sheets

HIGH DENSITY PRINTED WIRING BOARD HAVING IN-VIA SURFACE MOUNTING, PADS

FIELD OF THE INVENTION

The present invention relates to a high density printed wiring board having blind vias configured as surface mounting pads for surface mount electrical/electronic components, and to a method of manufacturing said wiring board.

BACKGROUND OF THE INVENTION

It is known to employ blind vias in multi-layer wiring boards as a means of electrically connecting circuits formed in copper foil layers on opposite faces of laminae comprising the board. This can be better understood by reference to FIGS. 5(a) to 5(g) which illustrate a method of forming a conventional printed wiring board having blind via electrical connects.

FIG. 5(a) shows a two-sided printed wiring board lamina 10 before lamination with similar laminae to form a printed wiring board. The lamina 10 has a dielectric resin substrate 12 with copper foil layers (14,16) formed on opposite surfaces thereof. In a first process step for forming a conventional printed wiring board, a through hole 18 is drilled in the lamina 10, as illustrated in FIG. 5(b). As a second step (FIG. 5(c)), the through hole 18 is plated to form an electrical connect layer 20 extending between the surface copper foil layers (14,16) of the lamina 10. As illustrated in FIG. 5(c), the through hole plated layer 20 extends a short radial distance l over the surface copper foil layers (14,16) of the lamina 10 in the proximity of the through hole 18 and, as such, sits higher than the surface copper layers (14,16). Also as illustrated in FIG. 5(c), the lower (as shown in the drawing) surface foil layer 16, which will become a buried inner layer of the printed wiring board when formed, is imaged and etched to form a electrical circuit 22 thereon.

FIG. 5(d) illustrates how a conventional printed wiring board 24 can be formed from laminae 10 of identical or similar form to that illustrated in FIG. 5(c). The laminae 10 are placed together with a prepeg separation layer 26 inserted therebetween at the time of lamination in a conventional manner. The lamination process results in the innermost openings of the through holes 18 in the laminae 10 being covered thus constituting blind vias 28 which electrically connect circuits formed on the opposing surfaces of their respective lamina. The lamination process may also result in some prepeg material being forced into the holes 18 of the blind vias 28. After the lamination process, a through hole 30 to electrically connect the outer copper foil layers 14 and the buried inner circuit layers 22 is drilled in the printed wiring board and plated also in a conventional manner. The outer surface copper layers 14 of the printed wiring board 24 can then be imaged and etched to form outer electrical circuits 32. In particular, re-flow pads 34 may be formed for mounting electrical components on the surfaces 14 of the printed wiring board 24. As more readily seen in FIG. 6, the re-flow pads 34 are electrically connected to the through hole plated layers 20 by narrow conductor lines 36. A re-flow pad is used only for mounting a surface mount component and a narrow conductor line is used only for connecting this to a through hole plated layer of a blind via. Flat areas are necessary for mounting surface mount components. Consequently, it can be seen from FIG. 6 that the surface area occupied by a dog bone contact pad means consisting of a re-flow pad, a narrow conducting line and a blind via plated layer is considerably greater than the area occupied by only the blind via plating layer. A consequence of this is illustrated by FIG. 7 which is a side sectional view of an upper portion of a printed wiring board 24 on which electrical component 38 has been mounted. The contact elements 40 of the component 38 are attached to reflow pads 34 of dog bone contact pad means which are spaced inwardly from corresponding blind vias 28. It will be appreciated that the surface envelope E surrounding the component and the contact pad means mounting it on the board has a surface area substantially greater than that of the component itself.

The amount of surface area occupied by the dog bone contact pad means is particularly acute with respect to mounting electrical components have a ball grid array (BGA) surface contact arrangement. As illustrated in FIG. 8, the surface area (bounded by broken line El) occupied by the contact pad means 42 is such that it dictates a minimum spacing between BGA contact pads (not shown). This would still be the case if only a small number of the BGA electrical connections are to be made through blind vias to other circuit layers of the printed wiring board.

Accordingly, the maximum mounting density for surface mount components and, in particular, surface mount components having a BGA mounting arrangement is relatively low.

Another conventional printed wiring board having blind holes formed by laser is described below with reference to FIGS. 9(a) and 9(b).

More specifically, a printed wiring board 100 includes a dielectric resin substrate, 102, copper conductor pads (inner layer pattern) 104 and 109 on opposing surfaces of the substrate 102, dielectric resin layers 101 and 103 laminated on opposing surfaces of the substrate 102, outer layer copper reflow pads 108 and 113, and outer layer copper conductor lines 105 and 110. Blind holes 106 and 111 which have copper plating layers 107 and 112 are formed in the dielectric resin layers 101 and 103. Plated through holes 114 and 115 are formed through the layers 101 and 103 and the substrate 102 and have through hole copper plating layers 116 and 117 for connecting outer layers with the inner pads 104 and 109. The reflow pads 108 and 113 which mount electric components of the surface are connected to the copper layers 107 and 112 of the blind holes 106 and 111 by narrow conductor lines 105 and 110. The inner layer conductor pads 104 and 109 are connected to the narrow conductor lines 105 and 110, and thus the outer layers 108 and 113, by the copper plating layers 107 and 112 of the blind holes 106 and 111.

FIGS. 10(a) to 10(g) illustrate a conventional printed wiring board manufacturing process which uses a laser beam.

In the first step of the process, the inner layer conductor pads 104 and 109 are etched and formed on both surfaces of the dielectric resin substrate 102 as shown in FIG. 10(a). In the second step of the process, the dielectric resin layers 101 and 103, and copper foil layers (outer layers) 105a and 110a are laminated and pressed onto the substrate as etched and formed in the first step shown in FIG. 10(a), in a heated environment. In the third step of the process, special windows 118 and 119, through which a laser beam can be radiated, are etched as shown in FIG. 10(c). In the fourth step of the process, laser beams 120 are radiated through the windows 118 and 119 to form blind holes 106 and 111 which reach the inner layer conductor pads 104 and 109, as shown in FIG. 10(d). In the fifth step of the process, through holes 114 and 115 are drilled as shown in FIG. 10(e). In the sixth step of the process, blind holes 106 and 111, and through holes 114 and 115 are plated with plating layers 107, 112, 116 and 117 as shown in FIG. 10(f) for connecting the copper foil layers 105a and 110a with the inner layer pads 104 and 109. In the last step of the process, the copper foil layers 105a and 110a are etched to form narrow outer layer conductor lines 105 and 110 and reflow pads 108 and 113, as shown in FIG. 10(g).

However, as for the first conventional printed wiring board as described above with respect to FIGS. 5 to 8, on the second conventional printed wiring board 100, the reflow pads 108 and 113 are used only for mounting surface mount components, and the narrow conductor lines 105 and 110 are used only for connecting to the blind holes 106 and 111, respectively, because the conductor pad means around the blind holes 106 and 111 are higher than the outer layer copper areas and flat surfaces are necessary for mounting the surface mount components.

Accordingly, the maximum mounting density for surface mounted components on the second conventional printed wiring board as abovedescribed is relatively low.

In the case of the conventional printed wiring board formed by the process illustrated by FIGS. 10(a) to 10(g), U.S. Pat. No. 5,315,072 discloses a method to overcome the problem of the contact pads means being higher than the outer layer copper areas around the blind holes. The method involves forming in separate laminae blind holes which, when the laminae are placed (laminated) together, are directed inwardly of the reflow pads which extend over the blind holes. In this way, the surface area occupied by the contact pad means is reduced when compared to the conventional arrangements. However, the process for forming a printed wiring board in accordance with U.S. Pat. No. 5,315,072 involves a number of additional process steps over the conventional process illustrated by FIGS. 10(a) to 10(g).

OBJECT OF THE INVENTION

It is an object of the present invention to provide a printed wiring board and a method of forming the same that obviates disadvantages associated with conventional printed wiring boards and methods of manufacturing such boards.

It is another object of the present invention to provide a method of manufacturing a printed wiring board having in-via surface mount pads and a printed wiring board manufactured by the method.

It is a further object of the present invention to provide a printed wiring board having a high mounting density for surface mount components.

SUMMARY OF THE INVENTION

According to a first aspect of the present invention, there is provided a printed wiring board, comprising: a plurality of spaced a part circuit layers, at least two of said layers being electrically connected by a blind hole/via, wherein a surface contact pad is formed by depositing over said blind hole/via an electrically conductive metallic layer.

According to a second aspect of the present invention, there is provided a method of manufacturing a printed wiring board, comprising the steps of: providing a printed wiring board with a plurality of spaced a part conductor layers, at least two of said layers being electrically connected by a blind hole/via; and forming a surface contact pad by depositing an electroconductive metallic layer over said blind hole/via.

BRIEF DESCRIPTION OF THE DRAWINGS

For a better understanding of the invention and to show how the same may be carried into effect, there will now be described by way of example only, embodiments according to the present invention with reference to accompanying drawings in which.

DETAILED DESCRIPTION OF THE PREFERRED EMBODIMENTS

There will now be described by way of example preferred embodiments of the present invention. In the following description, numerous specific details are set forth in order to provide a thorough understanding of the present invention. It will be apparent, however, to one skilled in the art, that the present invention may be practised without limitation to the specific details. In other instances, well known methods and structures have not been described in detail so as not to unnecessarily obscure the present invention.

Figure 1:
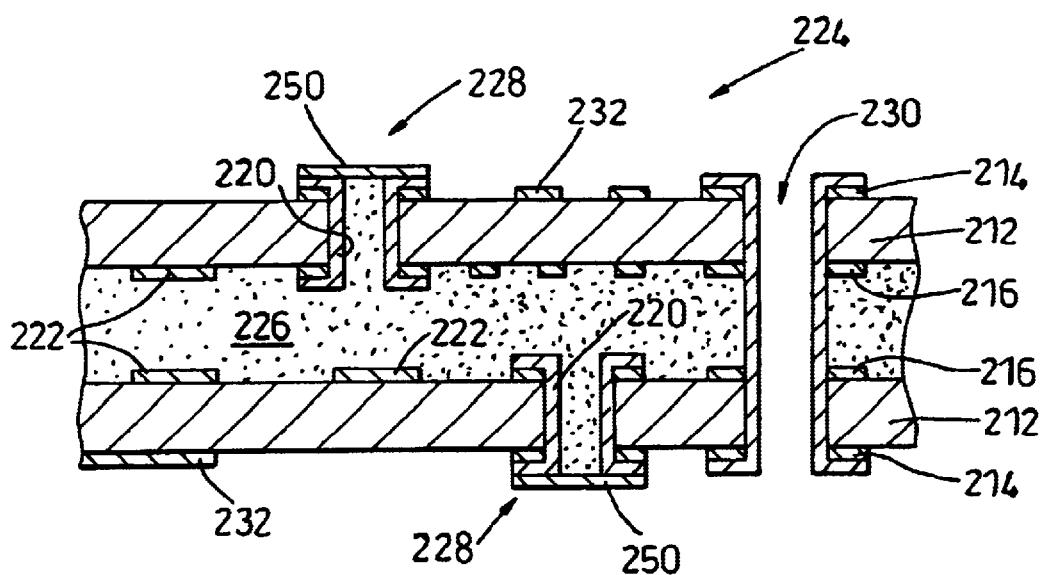
FIG. 1 is a side sectional view in schematic form of a first embodiment of a printed wiring board.
Figure 5A:
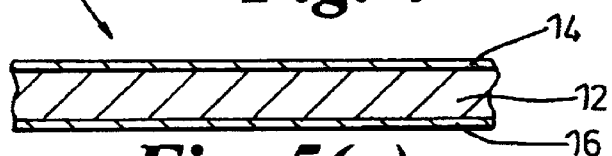
FIGS. 5(a) to 5(d) are sectional views in schematic form showing the manufacturing steps involved in the method of manufacturing a first conventional printed wiring board.
Figure 5B:
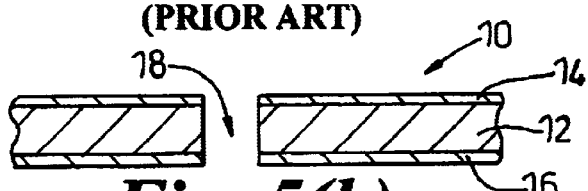
Figure 5C:
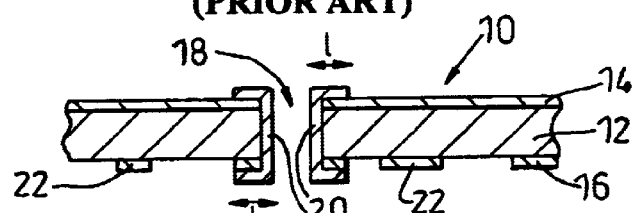
Figure 5D:
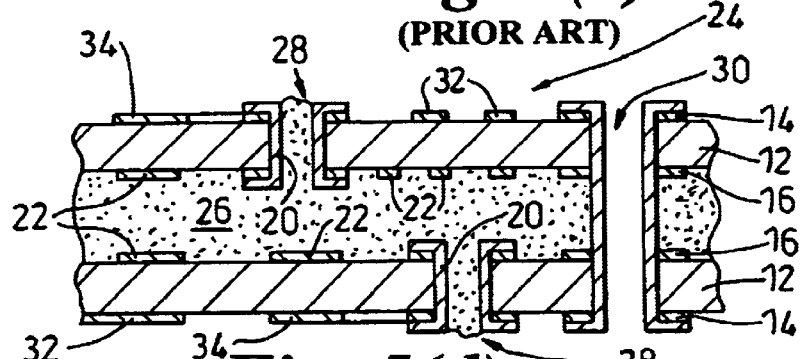
Figure 6:
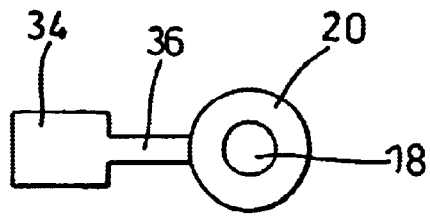
FIG. 6 is a plan view of a contact pad means for the first conventional printed wiring board.
Figure 7:
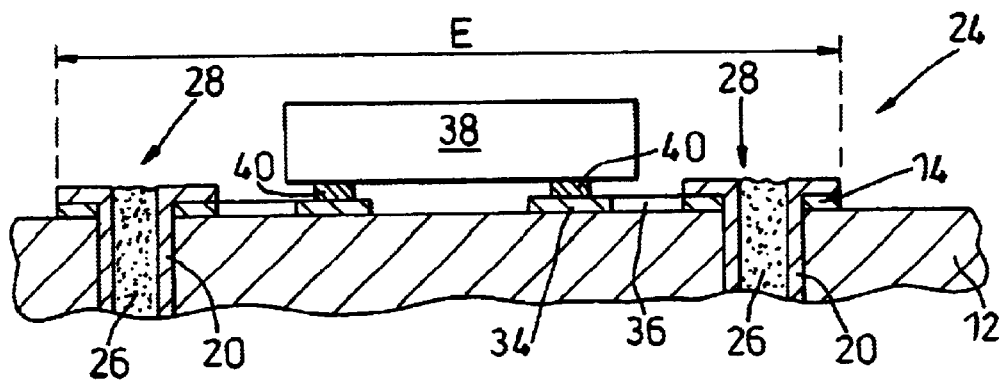
FIG. 7 is a side sectional view of an upper portion of the first conventional printed wiring board showing a component mounted thereon.
Figure 8:
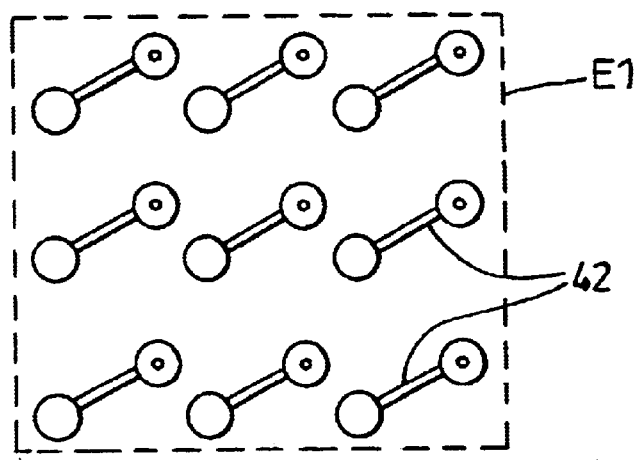
FIG. 8 is a plan view of a BGA contact pad means arrangement for the first conventional printed wiring board.

Referring to FIG. 1, it can be seen that a first embodiment of a printed wiring board in accordance with the present invention has a structure generally similar to that of the first conventional printed wiring board in FIG. 5(d). In the following description, like numerals to those used in connection with the first conventional printed wiring board will be employed but prefixed by a "2".

The structure of the printed wiring board 224 in accordance with a first embodiment of the invention differs from that of the first conventional printed wiring board in that reflow pads 250 for mounting surface mount components to the board 224 are formed to be coincident with the blind vias 228. As such, there is no requirement for narrow conductor lines to connect the reflow pad to the blind via-plated layers 220. As a consequence, contact pad means of the first embodiment occupy a board surface area no greater than the surface area of a plated layer of a blind via itself.

Figure 2:
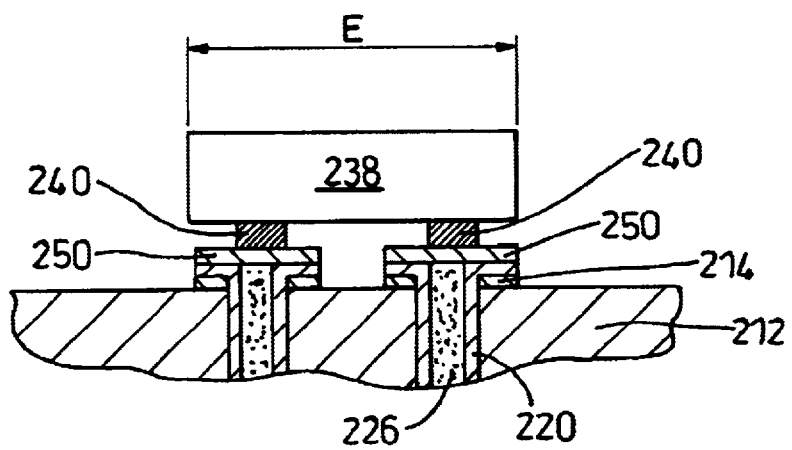
FIG. 2 is a side sectional view of an upper portion of the embodiment of FIG. 1 showing a component mounted thereon.

As illustrated in FIG. 2 which shows a surface mount component 238 attached to contact pad means of the printed wiring board, it can be seen that the surface area occupied by the surface envelope E enclosing the component and contact pad means is, in fact, the surface area occupied by the component itself since the contact pad means lie within the envelope E of the component. It will be appreciated that with such an arrangement it is possible to mount components on the board more closely together thus increasing the component mounting density of the board.

Figure 3:
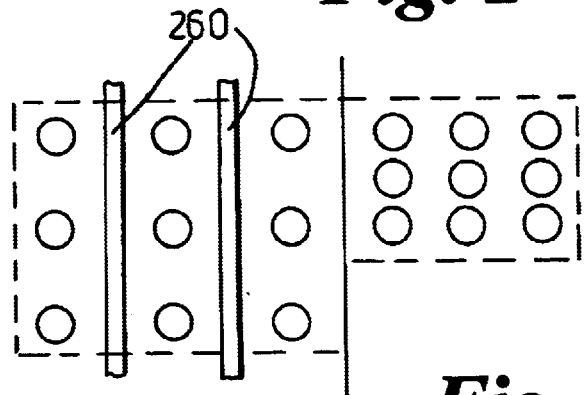
FIG. 3 is a plan view of a ball grid array (BGA) contact pad means arrangement for the first embodiment.
Figure 4:
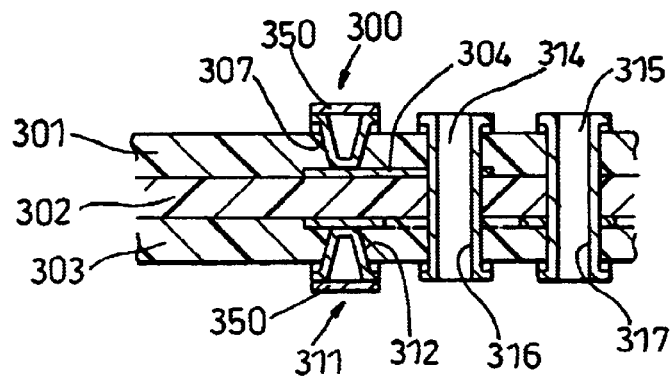
FIG. 4 is a side sectional view in schematic form of a second embodiment of a printed wiring board in accordance with the invention.

FIG. 3 is a plan view of a ball grid array (BGA) contact pad means arrangement achievable with the printed wiring board according to the first embodiment of the invention. Since the contact pad means are not of the conventional dog bone form, it is possible to more closely place the contact pad means together, as shown in the left half of the drawings, where the component structure permits. In the case where the spacing between contact pads (balls) of the component having a BGA mounting arrangement cannot be brought closer together due to physical and operating requirements of the component, as shown in the right hand half of the drawings, it is possible to use the space between the rows of BGA contact pad means on the printed board to route connector tracks 260 for other components. In the conventional boards as aforedescribed, the dog bone arrangement of the contact pad means and the limited spacing between such contact pad means for a BGA arrangement are such that it is not possible to utilise the space between the contact pad means for routing connector tracks. In the present invention, the availability of this space for routing connector tracks allows the wiring density on the board to be greatly increased as will be apparent to a skilled man.

In a method of manufacturing a printed wiring board having the structure of the first embodiment of the invention, it will be appreciated that the manufacturing process is generally similar to that described in connection with the first conventional printed wiring board as illustrated by FIGS. 5(a) to 5(d). The process is modified, however, to include an additional step prior to plating the drilled through hole 230 (referenced as 30 in FIG. 5(d)). This additional step is to treat the surfaces of the board to prepare the outward facing surfaces of the plated layers of the blind vias to receive a copper capping layer. The process step comprises cleaning the outer surfaces of the board with a pumice scrub which also slightly roughens said surface but which does not abrade the blind via plated layers which sit higher than the remaining copper area of the surfaces. In fact, it is only necessary to treat those parts of the outer surfaces which are to be plated but in the case of pumice scrubbing, it is more convenient to treat the whole surface than to mask the surface and treat only those portions requiring such treatment. It will be appreciated by one skilled in the art that any other suitable process for preparing the portions of the outer surfaces of the board which are to be plated can be employed. A further advantage of the pumice scrubbing step is that it removes any prepeg material which extends upwardly through the holes of the blind vias above the level of the plated layers of said vias.

Once the outer surfaces of the board are prepared, the through hole is plated in the conventional manner and simultaneous with this the blind vias are capped with a copper layer in the same process.

As a further preliminary step to the through hole plating step, it is preferable that the surface of the prepeg material in the blind via holes is treated to roughen it in preparation for the plating process. This can be achieved by applying a chemical etchant to the surface of the prepeg material. An agent such as permanganate desmear would be suitable for this process although one skilled in the art would recognise that any other suitable etchant can be employed.

It can be seen that the manufacturing process for providing printed wiring boards in accordance with a first embodiment of the invention requires only one additional step of treating the surfaces of the boards prior to plating the through hole (or through holes) and a modification of the through hole plating step to include depositing capping layers on the lined vias as required.

It will be appreciated that a printed wiring board providing the advantages as provided by the board according to the first embodiment of the invention can be formed with a combination of conventional contact pad means and in-via contact pad means as required.

Figure 9A:
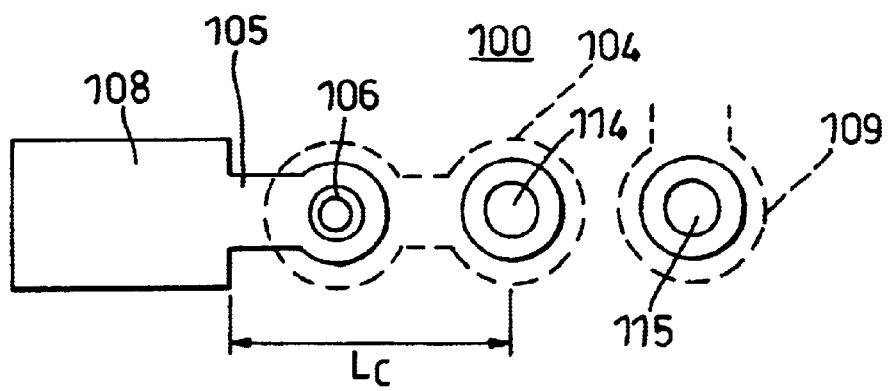
FIG. 9(a) is plan view of a contact pad means for a second conventional printed wiring board.
Figure 9B:
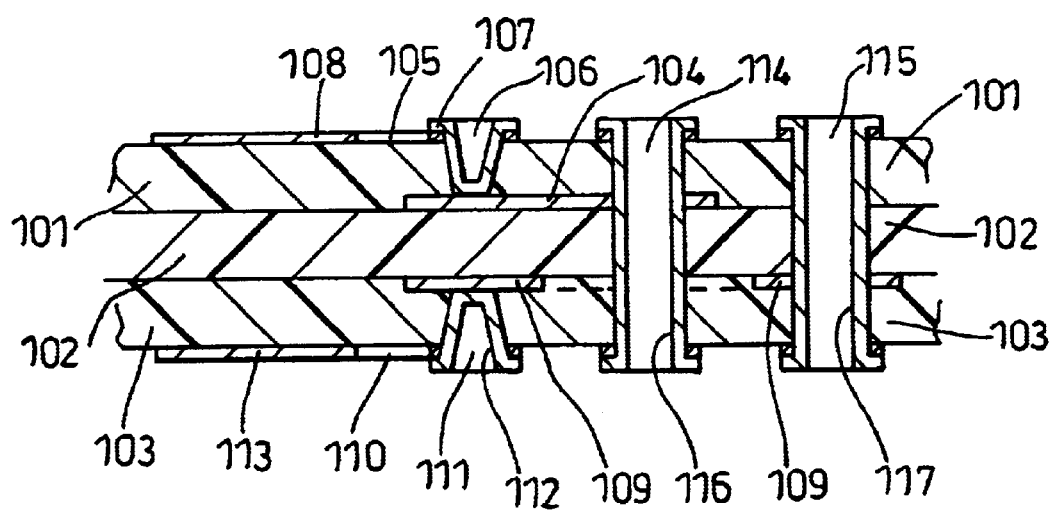
FIG. 9(b) is a side sectional view of schematic form of a second conventional printed wiring board.
Figure 10A:
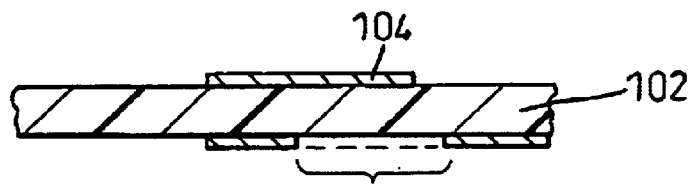
FIGS. 10(a) to 10(g) are side sectional views in schematic form showing the manufacturing steps involved in the method of manufacturing the second conventional printed wiring board.
Figure 10B:
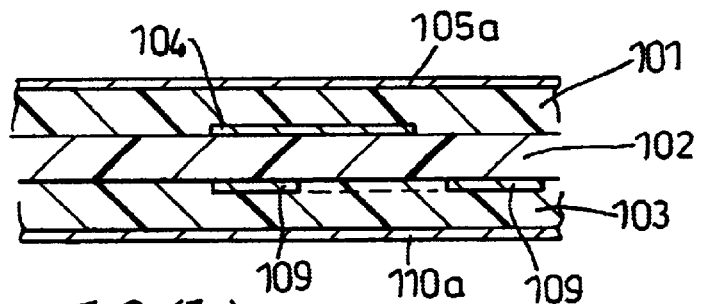
Figure 10C:
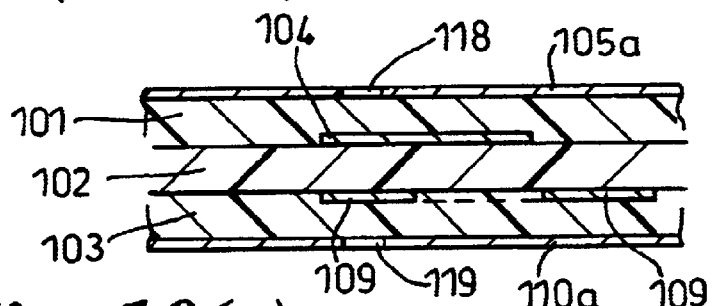
Figure 10D:
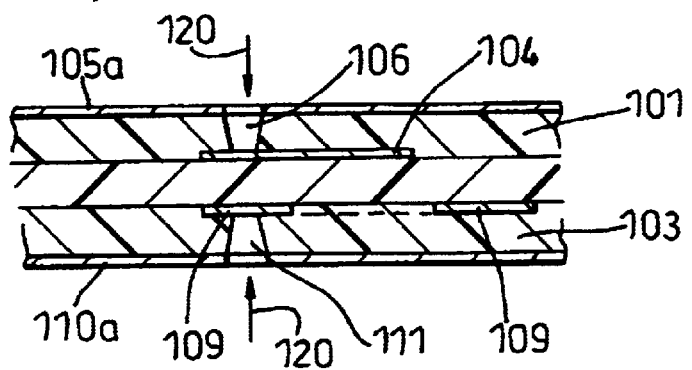
Figure 10E:
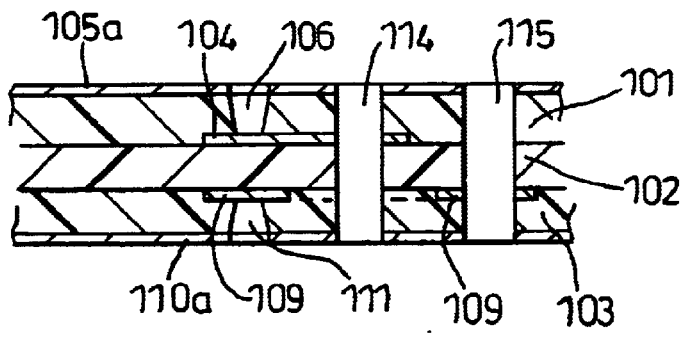
Figure 10F:
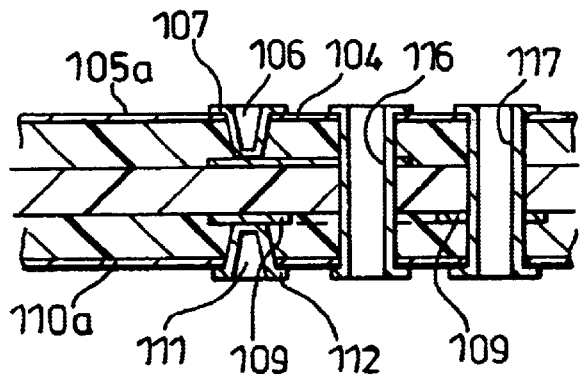
Figure 10G:
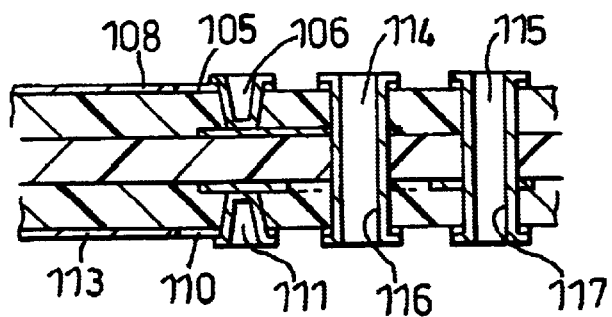

A printed wiring board in accordance with a second embodiment of the invention has a structure generally similar to that of the second conventional printed wiring board illustrated in FIG. 9(b). In the following description, like numerals to those used in connection with the second conventional printed wiring board will be employed but prefixed by a "3" rather than a "1" as in FIGS. 9 and 10. As with the first embodiment of the invention, the difference between the second embodiment and the conventional board illustrated in FIG. 9(b) is that contact pad means are formed by capping with a electrically conductive metallic material such as copper the blind holes (306,311) thus negating the need to have outwardly extending reflow pads connected to the plated layers of the blind holes via a narrow conducting lines. The advantages provided by this embodiment of the invention are generally identical to those as described with respect to the first embodiment.

A manufacturing process for the printed wiring board in accordance with the second embodiment of the invention is generally similar to that as described with reference to FIGS. 10(a) to 10(g) for the second conventional printed wiring board. In order to provide printed wiring boards in accordance with the second embodiment, it is possible modify the process for the second conventional wiring board in a number of ways. A first modification of the process is to proceed to the step of plating the through holes (311,315) and laser formed blind holes (306,311). Following this, it is necessary to fill the blind holes with an electro-conductive material such as an electro-conductive paste containing metallic particles, to prepare the outer surfaces of the board or at least the outwardly facing portions of the blind hole plated layers in preparation for a further plating step in which copper capping layers 350 are deposited over the blind holes.

As an alternative to the above, the process may comprise proceeding to the conventional process step of laser forming the blind holes, plating the blind holes, filling the blind holes with an electro-conductive filler material, drilling the through holes, preparing the surfaces of the board for the further plating process and then plating the through holes and simultaneously plating the blind holes with a copper capping layer.

It will be apparent to a man skilled in the art that it is possible to modify in other ways the conventional process for forming the second conventional printed wiring board in order to provide a process for forming the wiring board in accordance with the second embodiment of the invention.

What is claimed is:

1. A printed circuit board comprising:
   a) a plurality of spaced apart circuit layers;
   b) a drill or laser formed blind hole/via extending between a surface circuit layer and at least one other circuit layer, said blind hole/via having an electrical connect layer which electrically connects said surface circuit layer to said at least one other circuit layer;

c) a reflow pad for mounting a component to the surface circuit layer, said reflow pad extending over a surface part of said electrical connect layer, and also extending over the blind hole/via, the surface part of the electrical connect layer extending a short distance over the surface of the surface circuit layer such that the reflow pad is located upon that part of the electrical connect layer that extends over the surface of the circuit layer; and d) an electro-conductive material filling the blind hole/via.

* * * * *